(12) United States Patent
Miyake et al.

(10) Patent No.: US 6,468,884 B2
(45) Date of Patent: Oct. 22, 2002

(54) METHOD OF FORMING SILICON-CONTAINED CRYSTAL THIN FILM

(75) Inventors: Koji Miyake; Kiyoshi Ogata, both of Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/765,728

(22) Filed: Jan. 19, 2001

(65) Prior Publication Data

US 2001/0019877 A1 Sep. 6, 2001

(30) Foreign Application Priority Data

Jan. 21, 2000 (JP) ........................................ 2000-012618

(51) Int. Cl.⁷ ............................................... H01L 21/36
(52) U.S. Cl. ...................... 438/481; 438/478; 438/400; 136/255; 252/501.1; 252/510
(58) Field of Search .................. 438/481, 400, 438/4, 7; 252/501.1, 510; 136/255

(56) References Cited

U.S. PATENT DOCUMENTS

| 4,409,134 | A | * | 10/1983 | Yamazaki ................. 252/501.1 |
| 4,433,202 | A | * | 2/1984 | Maruyama et al. .......... 136/255 |
| 5,017,308 | A | * | 5/1991 | Iijima et al. ............. 252/501.1 |
| 5,744,370 | A | * | 4/1998 | Nakamura ..................... 437/4 |

FOREIGN PATENT DOCUMENTS

| EP | 0 849 788 A2 | 6/1998 |
| EP | 0 971 395 A1 | 1/2000 |
| FR | 2 761 526 | 10/1998 |
| FR | 2 802 340 | 6/2001 |
| JP | 09331077 A | 12/1997 |
| JP | 10093122 A | 4/1998 |
| JP | 2000077287 A | 3/2000 |

\* cited by examiner

*Primary Examiner*—Richard Elms
*Assistant Examiner*—Pho M. Luu
(74) *Attorney, Agent, or Firm*—Arent Fox Kintner Plotkin & Kahn (57) ABSTRACT

A method of forming a silicon-contained crystal thin film can efficiently form the crystal thin film of a relatively large thickness. In the method, hydrogen ions are implanted into a silicon-contained crystal substrate. Voids are formed by immersing the ion-implanted crystal substrate in a melted metal liquid containing, e.g., silicon and indium for heating the substrate. While pressing an ion-injected surface of the substrate, the substrate is heated by the melted metal liquid to form the voids. By cooling the liquid, the silicon in the supersaturated liquid is deposited on the surface of the substrate so that the silicon-contained crystal film is formed on the surface of the substrate. The substrate is divided in the void-formed position. Thereby, a thin film including the silicon-contained crystal film layered on a portion of the substrate is obtained. The silicon-contained crystal thin film thus obtained can be adhered to a support substrate, if necessary.

15 Claims, 7 Drawing Sheets

METHOD OF FORMING SILICON-CONTAINED CRYSTAL THIN FILM

This invention is based on patent application No. 20005-12618 Pat. filed in Japan, the contents of which are hereby incorporated by reference.

BACKGROUND OF THE INVENTION

1. Field of the Invention

The invention relates to a method of forming a silicon-contained crystal thin film which can be used, e.g., in substrates for a solar battery, a liquid crystal display and a semiconductor device.

2. Description of the Background Art

In recent years, attention has been focused on a hydrogen ion injection peeling method as a method for forming a silicon-contained crystal thin film on a support substrate. The hydrogen ion injection peeling method is utilized for producing an SOI (Silicon On Insulator) substrate, a solar battery substrate and others.

An example of a method of forming an SOI substrate by the hydrogen ion injection peeling method will now be described with reference to FIG. 9.

Figure 9:
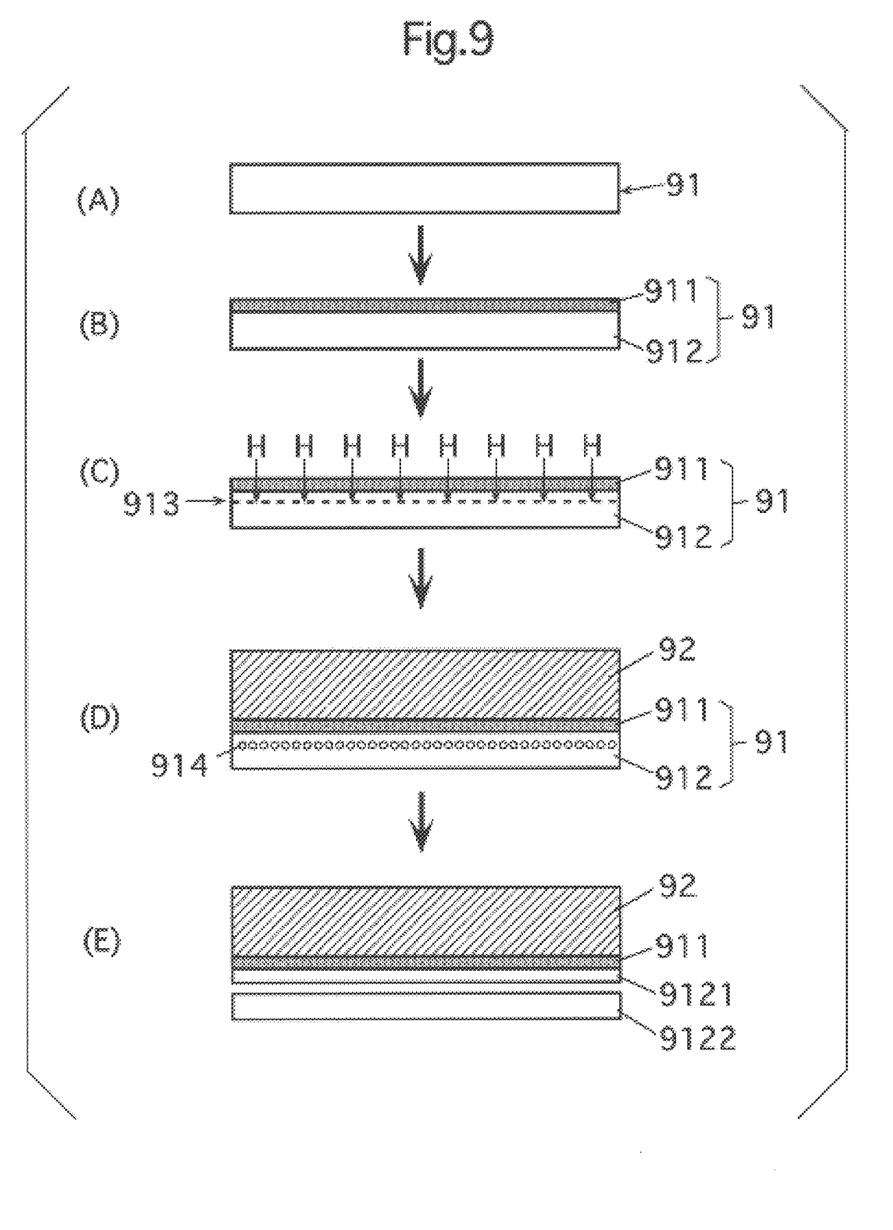
FIG. 9 is a step diagram showing an example of a method of forming a silicon-contained crystal thin film in the prior art.

First, a thermal oxide film ($SiO_2$ film) 911 is formed on an Si crystal substrate (see a step (B) in FIG. 9).

Then, hydrogen ions are injected into the Si crystal substrate 91 from the side of the thermal oxide film (see a step (C) in FIG. 9). By an ion acceleration voltage, an injection depth of hydrogen ions is controlled. In a later step, the crystal substrate 91 is separated (divided) in a position 913 where hydrogen ions are injected as described above. For this purpose, the hydrogen ions are injected at an injection density of about $5 \times 10^{16}$ ions/cm$^2$ or more.

Then, a support substrate 92 is laid on the ion-injected surface (thermal oxide film) of Si crystal substrate 91, and they are heated so that many voids or fine holes 914 are formed in the ion-implanted position 913 of the Si crystal substrate 91 (see a step (D) in FIG. 9). The hydrogen injected into the Si crystal substrate 91 is gasified by the heat so that the voids 914 are formed. The heating for forming the voids 914 is performed for several minutes at a temperature of about 350° C.–600° C. The neighboring voids are connected together. As a result of this connection and others, a weak or fragile portion having a layer-like form is formed in the void-formed portion of the Si crystal substrate 91. Since the ion-injected surface (thermal oxide film) of the Si crystal substrate 91 is subjected to a pressure applied by support substrate 92, this suppresses such a situation that the surface portion of the substrate 91 is partially peeled off due to the pressure by the hydrogen gas. Peeling which produces crater-like portions of several micrometers or less in diameter would occur in the surface portion of the crystal substrate 91 unless a pressure is applied to the ion-injected surface of the Si crystal substrate 91 by the foregoing manner or another appropriate manner.

Then, the Si crystal substrate 91 and the support substrate 92 are heated and adhered together at a high temperature of about 1000° C. or more.

Thereafter, the Si crystal substrate 91 is divided along the voids 914 (see a step (E) in FIG. 9). Thereby, an Si crystal thin film 9121, which was a portion of the crystal substrate 91, is left on the $SiO_2$ film 911. In this manner, the SOI substrate, i.e., the support substrate 92, on which the Si crystal thin film 9121 and the $SiO_2$ film (insulating film) 911 are layered, is formed. An Si crystal substrate portion 9122 other than the above can be used again in the next process of forming the SOI substrate.

However, the following problems arise in the above method of forming the silicon-contained crystal thin film on the support substrate, e.g., by implanting ions into the silicon-contained crystal substrate to form the voids.

One of the problems is that the foregoing method cannot efficiently form a relatively thick silicon-contained crystal thin film of tens of micrometers in thickness on the support substrate without difficulty. This will be described below in greater detail.

In the case where the substrate provided with the Si crystal thin film is to be utilized for manufacturing a solar battery, the Si crystal thin film must have a thickness of 7 pm or more, and more preferably, about 10 $\mu$m for achieving a high photoelectric conversion.

The thickness of the Si crystal thin film formed on the support substrate corresponds to the ion implantation depth in the hydrogen ion implanting processing, and can be increased by increasing the ion implantation depth. By increasing the ion acceleration voltage in the ion implantation process, the ion implantation depth can be increased within a limited extent. For implanting hydrogen ions to a position at a depth of, e.g., 10 $\mu$m from the surface (ion-injected surface) of the crystal substrate, the ion implantation is performed with an acceleration voltage of about 700 keV. However, for achieving the implantation depth of about 10 $\mu$m or more, a large-scale ion implanting device is required so that the ion implanting process requires a high cost. For suppressing excessive increase in temperature of the crystal substrate subjected to the ion implantation, it is necessary to suppress an ion beam current, and therefore it is impossible to perform efficiently the ion implantation achieving a required density.

According to the above manner, it is difficult to produce a relatively thick silicon-contained crystal thin film with high efficiency and low cost.

Another problem also arises. If particles are present on the ion-injected surface of the Si-contained crystal substrate, peeling of minute portions and/or cracks occur in the surface layer of the crystal substrate when heating the substrate for forming the voids. This will be further described below with reference to FIG. 10.

Figure 10:
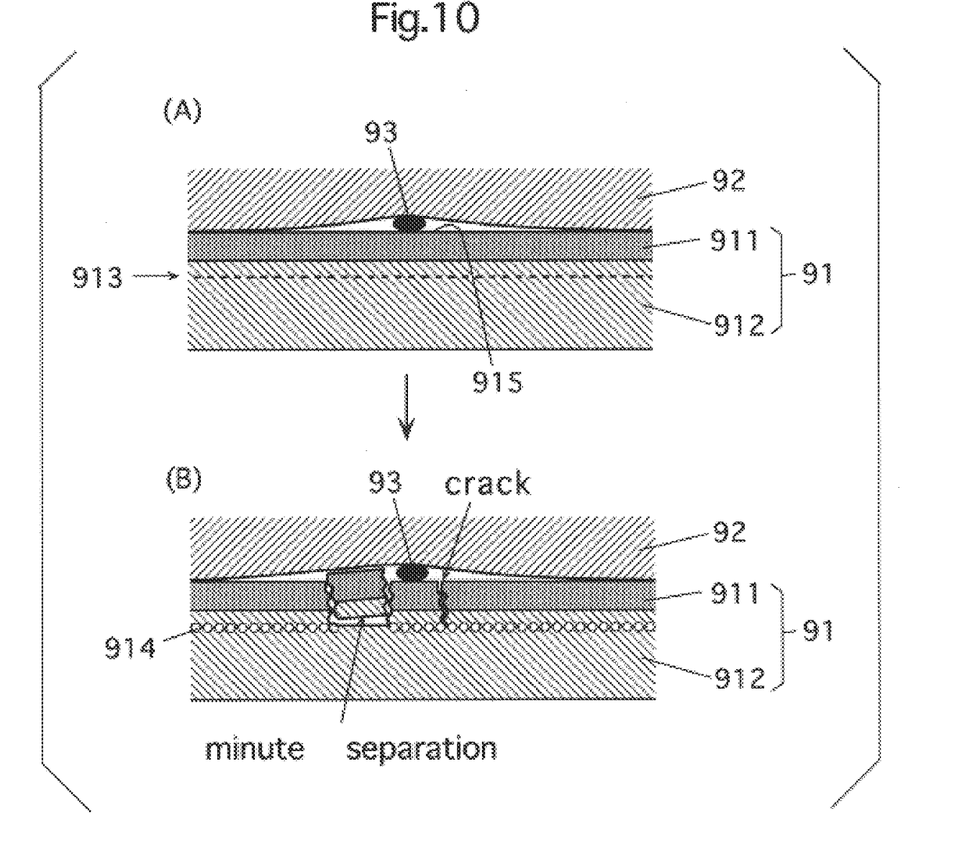
FIGS. 10(A) and 10(B) show a state in which a particle on an ion-injected surface causes a minute peeled portion and/or a crack when forming a silicon-contained crystal thin film by the method of forming the silicon-contained crystal thin film in the prior art shown in FIG. 9.

As can be seen in a step (A) shown in FIG. 10, a particle 93 is present on an ion-injected surface 915 of crystal substrate 91, and is interposed between the support substrate 92 and the crystal substrate 91. In this case, the ion-injected surface 915 has a portion, which is not pressed by the support substrate 92. When the heating for forming the voids is performed in the above state, peeling of minute portions and/or cracks may occur in and around the portion, which is not pressed by the support substrate 92, of the surface layer of crystal substrate 91, as can be seen in a step (B) shown in FIG. 10. Such minute peeled portions and cracks, which are present during the formation of voids, will cause a defect in the final product, i.e., the substrate provided with the crystal thin film. This lowers the productivity of the silicon-contained crystal thin films, and increases the manufacturing cost and selling price of the silicon-contained crystal thin film.

For example, it can be envisaged that the foregoing problem due to particles can be suppressed by executing the respective steps in a clean room of a high cleanliness. However, the clean room of a high cleanliness, which is required for overcoming the above problem due to particles, requires high construction, maintenance and operation costs, and thus increases the manufacturing cost of the substrate with the silicon-contained crystal thin film.

SUMMARY OF THE INVENTION

Accordingly, an object of the invention is to provide a method of forming a silicon-contained crystal thin film, which allows formation of the silicon-contained crystal thin film with high productivity and low cost.

More specifically, an object of the invention is to provide a method of forming a crystal thin film containing silicon, and particularly a method of forming a silicon-contained crystal thin film, which allows formation of the silicon-contained crystal thin film of a relatively large thickness with high efficiency.

Another object of the invention is to provide a method of forming a crystal thin film containing silicon on a support substrate, and particularly a method of forming the silicon-contained crystal thin film on the support substrate, which allows formation of the silicon-contained crystal thin film of a relatively large thickness with high efficiency.

Still another object of the invention is to provide a method of forming a crystal thin film containing silicon, e.g., by implanting ions into the crystal substrate containing silicon and forming voids, and particularly a method of forming the silicon-contained crystal thin film, which can suppress peeling of minute portions and generation of cracks in the crystal substrate during the process of forming the voids, even if particles are present on an ion-injected surface of the silicon-contained crystal substrate.

A further object of the invention is to provide a method of forming a crystal thin film containing silicon on a support substrate, e.g., by implanting ions into the crystal substrate containing silicon and forming voids, and particularly a method of forming the silicon-contained crystal thin film on the support substrate, which can suppress peeling of minute portions and generation of cracks in the crystal substrate during the process of forming the voids, even if particles are present on an ion-injected surface of the silicon-contained crystal substrate.

Basically, the invention provides first and second types of methods of forming a silicon-contained crystal thin film, which will be described below.

(1) Method of Forming a Silicon-Contained Crystal Thin Film of First Type

A method of forming a silicon-contained crystal thin film of the first type includes:

an ion implanting step of implanting hydrogen ions or helium ions into a silicon-contained crystal substrate containing silicon at 10% or more by weight;

a void forming step of forming a void in an ion-implanted position of the crystal substrate by heating the crystal substrate subjected to the ion implantation;

an epitaxial growth step of immersing the ion-implanted crystal substrate in a melted metal liquid containing silicon, and cooling the liquid to cause epitaxial growth to form a monocrystalline or polycrystalline thin film primarily made of silicon on an ion-injected surface of the substrate; and a dividing step of dividing the crystal substrate provided with the crystal thin film in the void-formed position, wherein the heating of the crystal substrate performed for the void formation in the void forming step is performed by immersing at least the ion-injected surface of the crystal substrate in the melted metal liquid used in the epitaxial growth step.

(2) Method of Forming a Silicon-Contained Crystal Thin Film of Second Type

A method of forming a silicon-contained crystal thin film of the second type includes:

an ion implanting step of implanting hydrogen ions or helium ions into a silicon-contained crystal substrate primarily made of silicon;

a film forming step of forming a predetermined film on an ion-injected surface of the silicon-contained crystal substrate;

a void forming step of forming a void in an ion-implanted position of the crystal substrate by heating the crystal substrate provided with the film; and a dividing step of dividing the crystal substrate in the void-formed position, wherein the film forming step is performed to provide a thickness of 2 $\mu$m or more from a surface of the film to the on-implanted position.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

As preferred embodiments, the invention basically provide methods of forming a silicon-contained crystal thin film of the following two, i.e., first and second types. These will now be described below.

(1) Method of Forming a Silicon-Contained Crystal Thin Film of First Type

A method of forming a silicon-contained crystal thin film of the first type includes:

an ion implanting step of implanting hydrogen ions or helium ions into a silicon-contained crystal substrate containing silicon at 10% or more by weight;

a void forming step of forming a void in an ion-implanted position of the crystal substrate by heating the crystal substrate subjected to the ion implantation;

an epitaxial growth step of immersing the ion-implanted crystal substrate in a melted metal liquid containing silicon, and cooling the liquid to cause epitaxial growth to form a monocrystalline or polycrystalline thin film primarily made of silicon on an ion-injected surface of the substrate; and a dividing step of dividing the crystal substrate provided with the crystal thin film in the void-formed position.

The heating of the crystal substrate performed for the void formation in the void forming step is performed by immersing at least the ion-injected surface of the crystal substrate in the melted metal liquid used in the epitaxial growth step.

This first type of the method of forming the silicon-contained crystal thin film may additionally include a step of adhering a support substrate, which will be described layer. Thereby, the silicon-contained crystal thin film may be formed on the support substrate. According to the method of forming the silicon-contained crystal thin film of the first type, it is possible to form the silicon-contained crystal thin film, which can be utilized for manufacturing a solar battery and others. Further, according to the method of forming the silicon-contained crystal thin film of the first type, a silicon carbide monocrystalline thin film for use, e.g., in an electric power device can be formed on the support substrate. According to the method of forming the silicon-contained crystal thin film of the first type, an SOI (Silicon On Insulator) substrate may be formed.

The method of forming the silicon-contained crystal thin film of the first type includes the ion implanting step, the void forming step, the epitaxial growth step and the dividing step. The method of forming the silicon-contained crystal thin film of the first type utilizes a so-called ion implantation peeling (separating) method or a so-called smart cut method. The respective steps will now be successively described in greater detail.

(1-1) Ion Implanting Step

In the ion implanting step, the hydrogen or helium ions are implanted into the silicon-contained crystal substrate.

The silicon-contained crystal substrate is formed of a monocrystalline or polycrystalline substrate containing silicon at 10% or more by weight. The silicon-contained crystal substrate may contain impurities serving as a donor or an acceptor. The silicon-contained crystal substrate may have a wafer-like form.

The hydrogen or helium ions are implanted into the silicon-contained crystal substrate and reach a position at a predetermined depth from the surface. The ion implantation can be performed, e.g., by an ion implanting device. The ion implantation depth can be controlled by an ion acceleration voltage used for the ion implantation. A larger ion acceleration voltage allows ion implantation to a deeper position. The ion implantation depth may be in a range from hundredths to tens of micrometers.

The ion implantation depth varies depending on the ion species even if the ion implantation is performed under the same ion implanting conditions. Therefore, it is preferable to use only one kind of ion species selected, e.g., by mass separation. For example, several kinds of hydrogen positive ions are present. For implanting the hydrogen positive ions, therefore, it is preferable to perform the mass separation for implanting only the predetermined one kind of hydrogen positive ions. In the process of implanting the hydrogen negative ions, the uniform ion implantation depth can be achieved without the mass separation because only one kind of hydrogen negative ions (H$^-$) are present.

The ion implanting step is a pre-step (pretreatment) for the void forming step of forming the voids in the silicon-contained crystal substrate and the separation step (dividing step) of separating (dividing) the crystal substrate in the void-formed position, as will be described later. For easy division of the crystal substrate, it is preferable to implant, e.g., the hydrogen ions at an implantation density of about $5 \times 10^{16}$ ions/cm$^2$ or more in the ion implanting step.

The ion implantation depth affects a separation position, where the ion-implanted silicon-contained crystal substrate is divided in the dividing step, as will be described later, and also affects the thickness of the silicon-contained crystal thin film of the final product. The larger ion implantation depth increases the thickness of the silicon-contained crystal thin film.

The ion implantation depth can be increased by increasing the ion acceleration voltage, as already described. However, the large ion acceleration voltage requires a large-scale ion implanting device. Also, the large ion acceleration voltage causes a problem of excessive rising of a temperature of the silicon-contained crystal substrate.

In the method of forming the silicon-contained crystal thin film of the first type according to the invention, the crystal thin film primarily made of silicon is formed on the ion-injected surface of the silicon-contained crystal substrate in the epitaxial growth step performed after the ion implanting step. Therefore, even if the silicon implantation depth is relatively small, the silicon-contained crystal thin film of a relatively large thickness can be finally obtained.

In the ion implanting step, ion implantation is effected on at least one of the surfaces of the silicon-contained crystal substrate. In the silicon implanting step, ion implantation may be effected on the opposite surfaces of the silicon-contained crystal substrate. By effecting the ion implantation on the opposite surfaces of the silicon-contained crystal substrate, the two silicon-contained crystal thin film can be finally produced.

(1-2) Void Forming Step

In the void forming step, the void is formed in the ion-implanted position of the crystal substrate by heating the silicon-contained crystal substrate subjected to the ion implantation in the ion implanting step.

The hydrogen or helium implanted into the silicon-contained crystal substrate gasifies when heated. This gasification produces the voids in the ion implanting position of the crystal substrate.

For forming the void, the crystal substrate may be heated, e.g., to a temperature from about 350° C. to about 600° C. or more for several minutes.

(1-3) Epitaxial Growth Step

In the epitaxial growth step, the crystal thin film (monocrystalline or polycrystalline thin film) primarily made of silicon is formed on the ion-injected surface of the silicon-contained crystal substrate. By the epitaxial growth of the crystal thin film primarily made of silicon, the crystal thin film primarily made of silicon is formed on the ion-injected surface of the silicon-contained crystal substrate.

The silicon-contained crystal substrate subjected to the ion implantation is immersed in the melted metal liquid containing silicon, and the liquid is cooled so that the silicon in supersaturated liquid is deposited on the silicon-contained crystal substrate, and the crystal thin film primarily made of silicon is formed on the ion-injected surface of the silicon-contained crystal substrate. Thus, by a liquid phase growth method, which is a kind of epitaxial growth method, the crystal thin film primarily made of silicon is formed on the ion-injected surface of the silicon-contained crystal substrate.

In addition to the liquid phase growth method, a gas phase growth method using a silane-contained gas is known as another kind of epitaxial growth method. However, the liquid phase growth method is superior to the gas phase growth method in cost and mass-productivity.

At least the ion-injected surface (i.e., the surface on which the crystal thin film is to be formed) of the silicon-contained crystal substrate is immersed in the melted metal liquid so that the crystal thin film is formed on the crystal substrate. The silicon-contained crystal substrate may be entirely immersed in the melted metal liquid.

In the ion implanting step, the ion implantation may be effected on the opposite surfaces of the silicon-contained crystal substrate, in which case it is merely required to immerse at least one of the ion-injected surfaces in the melted metal liquid. Both the ion-injected surfaces may be simultaneously immersed in the melted metal liquid, whereby the two silicon-contained crystal thin films can be finally produced with high efficiency.

The melted metal liquid in which the silicon-contained crystal substrate is immersed may contain, in addition to silicon, at least one kind of metal among indium, gallium, aluminum and copper, and may contain two or more kinds of them. In addition to silicon, the melted metal liquid in which the silicon-contained crystal substrate is immersed may contain at least one kind of metal among indium, gallium, aluminum and copper at a total rate of 10% or more by weight.

The melted metal liquid containing copper promotes separation of the melted metal liquid from the silicon-contained crystal substrate when the substrate is pulled up from the melted metal liquid.

By employing the melted metal liquid containing indium, gallium or aluminum, the crystal thin film primarily made of silicon and formed on the crystal substrate can contain indium, gallium or aluminum as dopant. The crystal thin film primarily made of silicon, containing indium, gallium or aluminum as dopant, can have p-type or n-type electric characteristics.

The melted metal liquid, in which the silicon-contained crystal substrate is immersed, may contain the material, which is selected depending on the purposes of the silicon-contained crystal thin film to be obtained finally.

It is preferable to dissolve a sufficient amount of silicon in the melted metal liquid, in which the silicon-contained crystal substrate is to be immersed, for efficiently forming the silicon-contained crystal thin film and for other purpose. For dissolving a sufficient amount of silicon in the melted metal liquid containing, e.g., indium, the silicon is dissolved to saturation in the liquid which is heated to a temperature from about 800° C. to about 1000° C.

In the process of cooling the melted metal liquid for immersing the silicon-contained crystal substrate therein, the temperature lowering rate significantly affects the crystallinity of the crystal thin film primarily made of silicon and formed on the crystal substrate. For example, by cooling the melted metal liquid at a rate from about 0.1° C./minute to about 5° C./minute, the produced crystal thin film can have good crystallinity.

In this manner, the silicon-contained crystal substrate, on which the crystal thin film primarily made of silicon is formed, is taken out from the melted metal liquid before the melted metal liquid for immersion is solidified.

After taking out the silicon-contained crystal substrate from the melted metal liquid, metal which was used for dissolving the silicon and is left on the crystal thin film, which is formed on the crystal substrate, may be removed by etching or the like, if necessary.

(1-4) Dividing Step

In the dividing step, the silicon-contained crystal substrate, on which the crystal thin film primarily made of silicon, is divided in the void-formed position (i.e., ion-implanted position).

For example, a force is applied to the opposite surfaces of the silicon-contained crystal substrate, in which the voids are formed in a layer-like region, in mutually different directions along the layer-like region of the voids. Alternatively, a pulling force is applied perpendicularly to the opposite surfaces of the silicon-contained crystal 5 substrate. Thereby, the crystal substrate can be divided. The portion containing the voids in the crystal substrate has a low strength. Therefore, the crystal substrate can be separated and peeled off in the void-formed position along the layer-like region of the voids.

Thereby, the silicon-contained crystal thin film is obtained. In the silicon-contained crystal thin film thus obtained, the crystal thin film primarily made of silicon is formed by the epitaxial growth step on a silicon-contained crystal thin film, which was a portion of the silicon-contained crystal substrate. The thickness of the portion (the silicon-contained crystal thin film), which was a portion of the silicon-contained crystal substrate, corresponds to the thickness of the crystal substrate portion from the ion-injected surface to the ion-implanted position (void-formed position).

The other portion of the silicon-contained crystal substrate can be reused in the next process of forming the silicon-contained crystal thin film, if allowed in view of its thickness.

(1-5) In the method of forming the silicon-contained crystal thin film of the first type, the heating of the crystal substrate for forming the voids in the void forming step is performed by immersing the crystal substrate in the melted metal liquid used in the epitaxial growth step. This will now be described in greater detail.

In the epitaxial growth step, it is necessary to heat the melted metal liquid, e.g., to a predetermined first temperature for dissolving a sufficient amount of silicon in the melted metal liquid, as already described. If the melted metal liquid contains, e.g., indium, the first temperature is in a range, e.g., from about 800° C. to about 1000° C. In the epitaxial growth step, it is necessary to cool the melted metal liquid from the first temperature to a predetermined second temperature (e.g., about 350° C.), which does not cause solidification of the metal, for depositing silicon. When the melted metal liquid cooled to the second temperature is to be used for forming the crystal thin film on another silicon-contained crystal substrate, it is necessary to heat the melted metal liquid to the first temperature again. For example, the melted metal liquid is heated from 350° C. to 800° C., and then is cooled from 800° C. to 350° C. In this case, even the operation of only cooling the melted metal liquid requires 90 minutes if the cooling rate is 5° C./minute or less for obtaining good crystals. For heating the melted metal liquid from 350° C. to 800° C., several minutes are required, although the required time depends on the performance and others of the heating device.

In the void forming step, the silicon-contained crystal substrate subjected to the ion implantation must be heated at the temperature of, e.g., 350° C.–600° C. for several minutes for forming the voids, as already described.

Accordingly, the crystal substrate can be set to the temperature required for the void formation by immersing the crystal substrate subjected to the ion implantation in the melted metal liquid in the epitaxial growth step. The crystal substrate subjected to the ion implantation may be immersed in the melted metal liquid while the melted metal liquid is being heated or being cooled. If the crystal substrate is immersed in the melted metal liquid after starting the cooling of the melted metal liquid, the formation of the voids can be performed simultaneously with the formation of the thin film by deposition. In summary, it is merely required to immerse the crystal substrate for a required time in the melted metal liquid at the temperature required for the void formation.

For example, in the case where the crystal substrate is immersed in the melted metal liquid for forming the voids while the melted metal liquid is being heated, it is possible to start the immersion of the crystal substrate in the melted metal liquid when the melted metal liquid is at a lower temperature than the temperature required for the void formation. For example, in the case where the crystal substrate is immersed in the melted metal liquid for forming the voids while it is being heated, such a manner may be employed that the crystal substrate is kept at the temperature required for the void formation for the required time, and then is temporarily removed from the melted metal liquid. Alternatively, the crystal substrate may be kept within the melted metal liquid until completion of the formation of the crystal thin film on the crystal substrate.

According to the method of forming the silicon-contained crystal thin film of the first type, the void forming step can be partially or entirely performed in parallel with the epitaxial growth step. During the processing in the epitaxial growth step, the void forming processing can be performed. It is not necessary to employ a heating device dedicated to the heating of the crystal substrate for void formation. Accordingly, the silicon-contained crystal thin film can be formed efficiently while requiring only a short time and few steps. Thereby, the silicon-contained crystal thin film can be manufactured with a low cost.

According to the method of forming the silicon-contained crystal thin film of the first type, the voids are formed by immersing the crystal substrate in the melted metal liquid. Therefore, a pressure can be applied to the ion-injected surface of the silicon-contained crystal substrate while the crystal substrate is being heated for the void formation.

If the pressure were not applied to the ion-injected surface of the crystal substrate during the heating of the crystal substrate for the void formation, a gas pressure caused by gasification of the implanted ions would cause partial peeling of the surface layer on the ion-injected side of the crystal substrate, and therefore crater-like holes of about several micrometers or less in diameter would be formed on the ion-injected surface.

In contrast to this, according to the method of forming the silicon-contained crystal thin film of the first type, the crystal substrate can be heated for the void formation while immersing the crystal substrate in the melted metal liquid and thereby applying a pressure to the ion-injected surface, as already described. Therefore, the partial peeling can be suppressed. It is possible to apply the pressure to the ion-injected surface during the void formation without requiring a device or the like for applying the pressure to the ion-injected surface. This allows formation of the voids with a low cost, and therefore allows formation of the silicon-contained crystal thin film with a low cost.

(1-6) The method of forming the silicon-contained crystal thin film of the first type may further include an adhering step of adhering a support substrate to the crystal thin film formed in the epitaxial growth step.

By the adhering step, it is possible to provide such a structure that the crystal thin film, which is formed in the epitaxial growth step and is primarily made of silicon, and the crystal thin film, which was a part of the silicon-contained crystal substrate, are successively formed on the support substrate.

The adhesion of the crystal thin film and the support substrate in the adhering step may be performed, e.g., by an adhesive. The adhesion between the crystal thin film and the support substrate may be performed by heating them at a high temperature after overlapping them together.

The adhering step may be performed, e.g., after the dividing step. More specifically, the silicon-contained crystal thin film, which is obtained in the dividing step, may be adhered to the support substrate. By performing the adhesion with the adhesive in the above case, the support substrate is not subjected to a high temperature. Therefore, the support substrate having a low softening point may be used, and the support substrate can be selected from a relatively wide range. For example, the support substrate may be formed of a glass substrate made of, e.g., a soda glass having a relatively low softening point.

The adhering step may be performed after the epitaxial growth step and before the dividing step. The support substrate may be adhered to the crystal thin film after the crystal thin film is formed on the silicon-contained crystal substrate in the epitaxial growth step, or after removing metal, which was used for dissolving the silicon, on the crystal thin film, if necessary. This adhesion may be performed with the adhesive, whereby the support substrate can be selected from a relatively wide range, similarly to the foregoing case.

(2) Method of Forming a Silicon-Contained Crystal Thin Film of the Second Type

A method of forming a silicon-contained crystal thin film of the second type includes:

an ion implanting step of implanting hydrogen ions or helium ions into a silicon-contained crystal substrate primarily made of silicon;

a film forming step of forming a predetermined film on an ion-injected surface of the silicon-contained crystal substrate;

a void forming step of forming a void in an ion-implanted position of the crystal substrate by heating the crystal substrate provided with the film; and a dividing step of dividing the crystal substrate in the void-formed position.

The film forming step is performed to provide a thickness of 2 µm or more from a surface of the film to the ion-implanted position.

The method of forming the silicon-contained crystal thin film of the second type may further include a support substrate adhering step, which will be described later, so that the silicon-contained crystal thin film can be formed on the support substrate. The method of forming the silicon-contained crystal thin film of the second type can be used for manufacturing a solar battery or the like, in which case a thin film having a pn structure or an npp+ structure can be formed on the support substrate. According to the method of forming the silicon-contained crystal thin film of the second type, a silicon carbide monocrystalline thin film, which is used, e.g., in an electric power device, may be formed on the support substrate. The method of forming the silicon-contained crystal thin film of the second type can also form an SOI (Silicon On Insulator) substrate.

The method of forming the silicon-contained crystal thin film of the second type includes the ion implanting step, the film forming step, the void forming step and the dividing step. Similarly to the method of forming the silicon-contained crystal thin film of the first type, the method of forming the silicon-contained crystal thin film of the second type utilizes a so-called ion implantation peeling (separating) method. The respective steps will now be described in greater detail.

(2-1) Ion Implanting Step

In the ion implanting step, the hydrogen or helium ions are implanted into the silicon-contained crystal substrate primarily made of silicon. The ion implantation is performed as a pretreatment for the processing of forming the voids in the silicon-contained crystal substrate in the void forming step, which will be described later.

The contents which are already described in connection with the ion implanting step in the item (1-1) can be substantially true also with respect to the ion implanting step in the method of forming the silicon-contained crystal thin film of the second type.

(2-2) Film Forming Step

In the film forming step, one or more predetermined film(s) are formed on the silicon-contained crystal substrate.

The film forming step is performed after the ion implanting step and before the void forming step, which will be described later.

In the film forming step, a predetermined film is formed on the ion-injected surface of the silicon-contained crystal substrate.

Before the ion implanting step (and therefore, before the film forming step), a film such as a thermal oxide film may be formed on the silicon-contained crystal substrate. Even in the case where the film formation is already effected on the silicon-contained crystal substrate before the ion implanting step and the film forming step, as described above, the predetermined film is formed on the ion-injected surface of the silicon-contained crystal substrate, as described above. In this case, if the ion implantation is effected on the side of the film (e.g., thermal oxide film or the like), which is formed on the silicon-contained crystal substrate before the ion implantation, the predetermined film is further formed on the surface (ion-injected surface) of the film, which is formed before the ion implanting step, in the film forming step.

Thus, the predetermined film formed in the film forming step is the film, which is formed after the ion implanting step, and is formed on the ion-injected surface of the silicon-contained crystal substrate.

In the film forming step, a CVD method, a paste applying method or the like amy be executed for forming the film.

For example, in the film forming step, an insulating film may be formed on the silicon-contained crystal substrate. The insulating film may be an $SiO_2$ film.

In the film forming step, an electrically conductive film may be formed on the silicon-contained crystal substrate. The electrically conductive film may be primarily made of, e.g., aluminum. The conductive film may be used, e.g., as an electrode.

(2-3) Void Forming Step

In the void forming step, the silicon-contained crystal substrate on which the film is formed in the film forming step is heated to form the voids in the ion-implanted position within the crystal substrate.

The contents which are already described in connection with the void forming step in the foregoing item (1-2) can be substantially true also with respect to the void forming step in the method of forming the silicon-contained crystal thin film of the second type.

(2-4) Deviding Step

In the dividing step, the silicon-contained crystal substrate is divided in the void-formed position.

This provides the silicon-contained crystal thin film, in which the film formed in the film forming step is formed on a crystal thin film, which was a portion of the silicon-contained crystal substrate and is primarily made of silicon.

The contents which are already described in connection with the dividing step in the foregoing item (1-4) can be substantially true also with respect to the dividing step in the method of forming the silicon-contained crystal thin film of the second type.

(2-5) In the method of forming the silicon-contained crystal thin film of the second type, the film forming step is executed to form the film on the ion-injected surface so as to provide a thickness of 2 µm or more from the surface of the film to the ion-implanted position. The film forming step is performed after the ion implanting step and before the void forming step, as already described.

Thereby, the ion-injected surface of the crystal substrate is pressed by the film, which is formed on the ion-injected surface in the film forming step, when the voids are being formed in the silicon-contained crystal substrate in the void forming step. Therefore, it is possible to suppress peeling of minute portions of the surface layer on the ion-injected surface side of the silicon-contained crystal substrate in the void formation step. The partial peeling can be suppressed without requiring means dedicated to pressing of the ion-injected surface of the silicon-contained crystal substrate. The film formed in the film forming step is utilized as pressing means for applying a pressure to the ion-injected surface of the silicon-contained crystal substrate so that the partial peeling can be suppressed.

Even if there is a particle on the ion-injected surface of the silicon-contained crystal substrate, the method of forming the silicon-contained crystal thin film of the second type can suppress the minute peeling of the crystal substrate during formation of the voids as described below.

If the following method, which is different from the method of the second type, is used for forming voids while pressing the ion-injected surface, minute peeling or the like is likely to occur in the crystal substrate. More specifically, if a second substrate is directly placed on the ion-injected surface for applying a pressure to the ion-injected surface by the second substrate during the void formation, minute peeling or cracks are likely to occur when particles are present on the ion-injected surface and, in other words, between the crystal substrate and the second substrate. This is probably caused by the facts that the ion-implanted position is usually spaced from the surface on the ion-injected side of the crystal substrate by only a small distance (ion implantation depth) of about 1 $\mu$m, and that the particle produces a portion on the ion-injected surface, which is not pressed by the second substrate.

In contrast to this, the method of forming the silicon-contained crystal thin film of the second type can overcome the above problem as follows. Even if particles are present on the ion-injected surface of the silicon-contained crystal substrate, the particles can be buried in the film, which is formed on the ion-injected surface, e.g., by a CVD method or a paste applying method in the film forming step. Thereby, even if the particles are present, the minute peeling can be suppressed by keeping a distance of 2 $\mu$m or more between the film surface to the ion-implanted position, although the particles may cause small irregularities on the film surface. By burying the particles in the film formed on the ion-injected surface, a portion which is not pressed against the ion-injected surface is not formed so that the minute peeling can be suppressed.

According to the method of forming the silicon-contained crystal thin film of the second type, therefore, conventional defects are not caused, and the silicon-contained crystal thin film having intended functions can be formed even if the particles, which are not excessively large in amount, are present on the ion-injected surface. Even if the particles are present on the ion-injected surface, the silicon-contained crystal thin film produced by the method does not have an unacceptable defect in contrast to the prior art. Therefore, the silicon-contained crystal thin film can be formed with high productivity and low cost. The silicon-contained crystal thin film having the intended functions can be formed even in an environment of a relatively low cleanliness (e.g., in a clean room of a relatively low cleanliness). This also allows inexpensive formation of the silicon-contained crystal thin film.

(2-6) The method of forming the silicon-contained crystal thin film of the second type may further include an adhering step of adhering the support substrate to the film formed in the film forming step.

By the adhering step, it is possible to provide a structure, in which the predetermined film formed in the film forming step and a crystal thin film, which was a portion of the silicon-contained crystal substrate, are successively formed on the support substrate. In the film forming step, an insulating film (e.g., SiO$_2$ film) may be formed, whereby it is possible to provide a so-called SOI (Silicon On Insulator) substrate, in which the insulating film and the film primarily made of silicon are successively formed on the support substrate. In the film forming step, an electrically conductive film (e.g., aluminum film) to be used as an electrode may be formed in the film forming step, whereby it is possible to provide a structure in which the electrode and the film primarily made of silicon are successively formed on the support substrate.

The adhesion between the predetermined film and the support substrate may be performed with an adhesive in the adhering step. The adhesion between the film and the support substrate may be performed by heating them at a high temperature after overlapping them.

The adhering step may be performed, e.g., after the dividing step. More specifically, the silicon-contained crystal thin film, which is obtained in the dividing step, may be adhered to the support substrate. In this case, an adhesive may be used for the adhesion, whereby the support substrate is not subjected to a high temperature so that even a support substrate having a low softening point can be employed, and the support substrate can be selected from a relatively wide range. For example, the support substrate may be formed of a glass substrate made of, e.g., a soda glass having a relatively low softening point.

The adhering step may be performed after the void forming step and before the dividing step. This adhesion may be performed with the adhesive, whereby the support substrate can be selected from a relatively wide range, similarly to the foregoing case.

The adhering step may be performed after the film forming step and before the void forming step. In this case, the support substrate is subjected, together with the crystal substrate, to a high temperature for the void formation. Therefore, the support substrate which is resistive to such a high temperature is employed.

(2-7) In the method of forming the silicon-contained crystal thin film of the second type, the film formed in the film forming step may be an electrically conductive film, as already described. The electrically conductive film may be primarily made of, e.g., aluminum, and a heating step may be further performed for heating the silicon-contained crystal substrate provided with this conductive film at a temperature of 500° C. or more for one or more hours. By this heating step, a p$^+$ layer may be formed by thermal diffusion of aluminum if the crystal substrate is formed of a p-type silicon substrate. Thereby, a thin film of a structure including a pp$^+$ layer and an electrode layer can be formed. After the dividing step, n-type dopant of phosphorus or the like may be diffused from the side of the separation surface (peeling surface) of the silicon-contained crystal substrate to form a n-type layer, whereby it is possible to form the thin film of a structure having an npp$^+$ layer and an electrode layer.

If the silicon-contained crystal substrate is heated at a temperature of 500° C. or more for one or more hours, the aluminum can be diffused in the silicon, and the voids can be formed. Accordingly, the heating in the heating step and the heating for void formation in the void forming step may be simultaneously performed in a single step.

Several examples of the method of forming the silicon-contained crystal thin film will now be described with reference to the drawings.

Figure 1A:
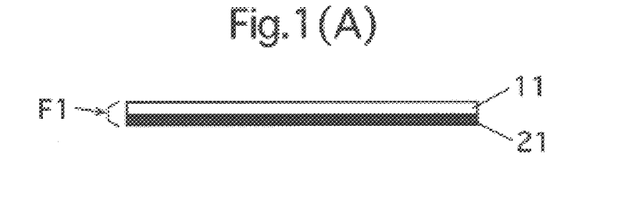
FIG. 1(A) is a schematic cross section of an example of a silicon-contained crystal thin film formed by a method of forming the silicon-contained crystal thin film according to the invention.

(1) FIG. 1(A) is a schematic cross section of an example of a silicon-contained crystal thin film, which can be formed by the method of forming the silicon-contained crystal thin film of the first type described before.

A silicon-contained crystal thin film F1 shown in FIG. 1(A) is formed of a monocrystalline silicon thin film 11 and a monocrystalline silicon thin film 21 layered together.

Figure 1B:
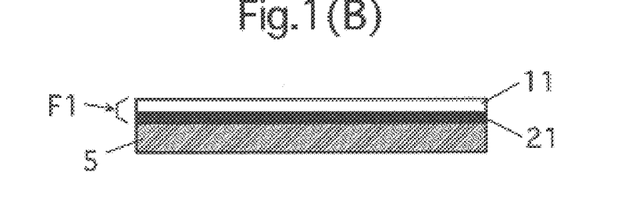
FIG. 1(B) is a schematic cross section of an example of a structure formed by the method of forming the silicon-contained crystal thin film according to the invention, and particularly a structure including the silicon-contained crystal thin film formed on a support substrate.

As shown in FIG. 1(B), the silicon-contained crystal thin film F1 can be formed on a support substrate 5. The support substrate 5 may be a glass substrate, a silicon substrate or the like.

A method of forming the silicon-contained crystal thin film F1 will now be described below with reference to a step diagram of FIG. 2.

First, a monocrystalline silicon substrate 1 is prepared. In this example, the crystal substrate 1 has a wafer-like form.

Figure 2:
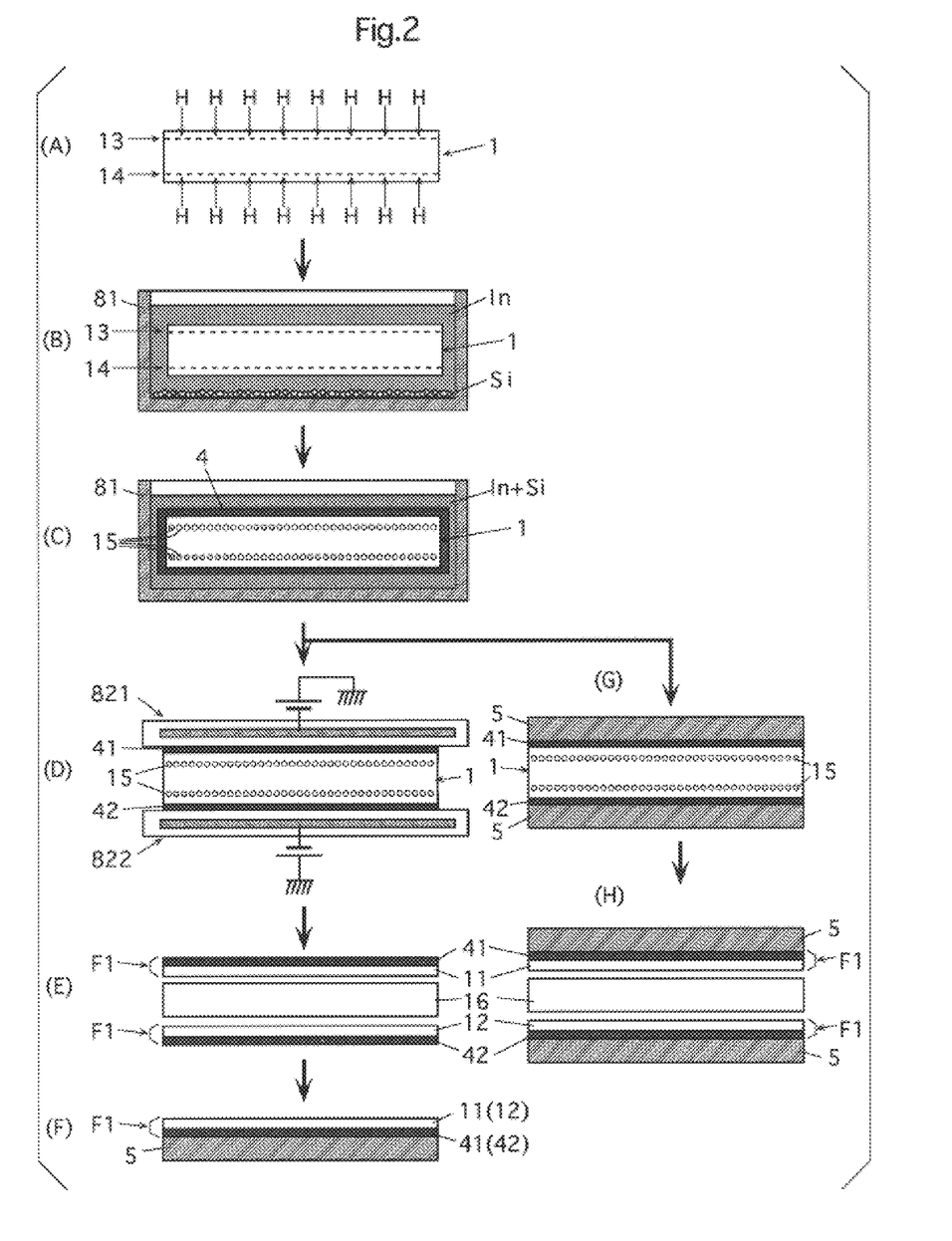
FIG. 2 shows steps in examples of the method of forming the silicon-contained crystal thin film according to the invention, and particularly steps for forming the silicon-contained crystal thin film shown in FIGS. 1(A) and 1(B)

Then, hydrogen ions are implanted into the opposite surfaces of the monocrystalline silicon substrate 1 (see step (A) in FIG. 2). In this example, negative hydrogen ions are implanted into the crystal substrate 1 with an acceleration voltage of 20 kV. Thereby, the hydrogen ions are implanted to positions at a depth of about 0.2 µm from the opposite surfaces of the crystal substrate 1, respectively. In this example, the negative hydrogen ions are implanted so that the ion implantation depth can be set uniform without requiring mass separation. The purpose of implanting the hydrogen ions to the opposite surfaces of the crystal substrate 1 is to obtain finally the two silicon-contained crystal thin films F1 at one time. The hydrogen ions are implanted at an implantation density of about $5\times10^{16}$ ions/cm² or more for facilitating the separation (division) of the crystal substrate 1 in a later step.

Instead of the hydrogen ions, helium ions may be implanted into the crystal substrate, although the acceleration voltage for achieving the same implantation depth must be higher than that for the hydrogen ions.

Then, the ion-implanted monocrystalline silicon substrate 1 as well as fine powder of indium and fine powder of silicon are placed within a boat 81 made of carbon, and are heated. When the temperature exceeds a melting point (about 157° C.) of indium, the indium powder gradually melt to cover the whole surface of the crystal substrate 1 with the indium liquid (see step (B) in FIG. 2). When the temperature further rises, the silicon is gradually dissolved in the indium liquid. Since the melting point of the silicon is higher than 1400° C., the silicon does not melt when the silicon is solely heated at a temperature lower than 1000° C. However, the silicon can be dissolved at a relatively low temperature by heating the silicon together with metal such as indium. The liquid thus prepared is heated to about 800° C.–1000° C. so that the silicon is dissolved to saturation. In this manner, the whole crystal substrate 1 is immersed in the liquid or liquid containing silicon and indium, and thereby is heated. Thereafter, the liquid containing silicon and indium is cooled at a rate of 0.1° C./minute–5° C./minute.

During this heating and cooling, the ion-implanted monocrystalline silicon substrate 1 is heated at a temperature of about 350° C.–600° C. for several minutes. Thereby, a large number of voids 15 are formed in layer-like regions at ion-implanted positions 13 and 14 of the crystal substrate 1 (see step (C) in FIG. 2). The hydrogen implanted into the crystal substrate 1 is gasified by the heat so that the voids 15 are formed. The voids 15 thus formed lower the strength of the crystal substrate 1 in the void-formed position.

By cooling the liquid in which silicon is dissolved to saturation, silicon in the supersaturated liquid is deposited on the surface of the monocrystalline silicon substrate 1. Thereby, a monocrystalline silicon film 4 is formed on the surface of the monocrystalline silicon substrate 1 including the ion-injected surfaces. The monocrystalline silicon film 4 is formed by epitaxial growth of the monocrystalline silicon on the substrate 1 made of monocrystalline silicon. Thus, the monocrystalline silicon film 4 is formed by a liquid phase growth method, which is a kind of the epitaxial growth method.

In this example, the crystal substrate 1 is placed within the carbon boat 81 containing the indium and silicon before the indium and silicon are melted or dissolved. Alternatively, the crystal substrate may be immersed in the liquid of indium after the indium is melted to form the liquid.

As already described, the liquid is cooled at a rate of 0.1° C./minute–5° C./minute, whereby the monocrystalline silicon film 4 having good crystallinity can be formed.

Then, the crystal substrate 1 on which the monocrystalline silicon film 4 is formed is taken out from the liquid before the indium solidifies. In accordance with timing for taking out the crystal substrate 1 from the liquid, it is possible to control the thickness of the monocrystalline silicon film 4 to be formed by the epitaxial growth. By the epitaxial growth, the thickness of the monocrystalline silicon film 4 may be increased to tens of micrometers. By performing the epitaxial growth operation one time, and more specifically, by performing one operation of depositing the silicon by cooling the liquid, the monocrystalline silicon film 4 may not be grown to a required thickness, in which case the epitaxial growth step is performed two or more times.

Then, etching is performed to remove unnecessary indium on the surface of the monocrystalline silicon film 4.

Then, a pulling force is applied perpendicularly to the opposite surfaces of the crystal substrate 1 provided with the monocrystalline silicon film 4 (see step (D) in FIG. 2). In this example, electrostatic chucks 821 and 822 are used for pulling the opposite surfaces of the crystal substrate 1. Thereby, the crystal substrate 1 is separated or divided in each of the positions of the crystal substrate 1, where the voids 15 are formed (see step (E) in FIG. 2). In this example, the hydrogen ions are injected through the opposite surfaces of the crystal substrate 1, as already described. Therefore, the voids 15 are formed in the two positions of the crystal substrate 1 so that the crystal substrate 1 can be divided into three.

Thereby, the above steps provide the monocrystalline silicon film F1 formed of the monocrystalline silicon film 11, which was a portion of the monocrystalline silicon substrate 1, and the monocrystalline silicon film 41 layered together. Also, the above steps provide the monocrystalline silicon film F1 formed of the monocrystalline silicon film 12, which was a portion of the monocrystalline silicon substrate 1, and the monocrystalline silicon film 42 layered together. Since the ion injection is effected on the opposite surfaces of the crystal substrate 1, the two monocrystalline silicon films F1 are obtained at the same time. Each of the monocrystalline film portions 11 and 12, which were parts or portions of the monocrystalline silicon substrate 1, of the monocrystalline silicon film F1 has the thickness substantially corresponding to the ion implantation depth in the ion implanting operation. A remaining monocrystalline silicon substrate portion 16 will be utilized for forming the monocrystalline silicon film F1 in the next process.

After forming the monocrystalline silicon film F1, the film F1 may be adhered to the support substrate 5 for forming the monocrystalline silicon film F1 on the support substrate 5 (step (F) in FIG. 2). The monocrystalline silicon film F1 may be adhered to the support substrate 5 by an adhesive. After overlapping the monocrystalline silicon film F1 with the support substrate 5, these may be heated to a high temperature for adhering them. If the adhesive is used for adhering the monocrystalline silicon film F1 and the support substrate 5 together, a substrate such as a soda glass substrate, which has a relatively low heat resistance, and therefore is inexpensive, may be employed as the support substrate 5. If the monocrystalline silicon film F1 is to be adhered to the support substrate 5 by the heating, a substrate such as a silicon substrate having a sufficient resistance against heat, which is applied for adhesion, is employed as the support substrate 5.

The monocrystalline silicon film F1 may be formed on the support substrate 5 in the following manner. The monocrystalline silicon substrate 1 provided with the monocrystalline silicon film 4 is taken out from the liquid, and the indium is removed from the surface of the monocrystalline silicon film 4. Then, the support substrate 5 is adhered to the surfaces of the monocrystalline silicon films 41 and 42 (see step (G) in FIG. 2). Thereafter, the crystal substrate 1 is divided or separated in the void-formed positions so that the structures each having the monocrystalline silicon film F1 formed on the support substrate 5 are produced (see step (H) in FIG. 2).

If necessary, the separation surfaces of the monocrystalline silicon films 11 and 12 may be flattened, e.g., by polishing. After adhering the monocrystalline silicon film F1 to the support substrate 5, the monocrystalline silicon film 11 (12) portion, which was a part of the monocrystalline silicon substrate, may be removed by etching or the like. Even if the monocrystalline silicon film 11 (12) portion is removed in this manner, the monocrystalline silicon film 41 (42), which was formed in the epitaxial growth step, is left on the support substrate 5. More specifically, only the monocrystalline silicon film 41 (42) of a high quality having no ion implantation defect is left of the support substrate 5.

According to the method of forming the silicon-contained crystal thin film of the first type described above, the monocrystalline silicon film F1 of a relatively large thickness can be obtained without performing implantation of hydrogen ions to the deep position in the ion implanting step, because the monocrystalline silicon film 4 is formed in the epitaxial growth step. Therefore, it is not necessary to increase the acceleration voltage to a large extent in the ion implanting operation, and the ion implantation can be performed by an ordinary ion accelerating device of a relatively small scale. Since the acceleration voltage can be relatively low, it is possible to suppress excessive rising of the temperature of the crystal substrate 1 in the ion implanting operation. Since it is not necessary to increase the acceleration voltage, it is not necessary to restrict an ion beam current, and the ions can be efficiently implanted to achieve a required density.

According to the method of forming the silicon-contained crystal thin film described above, the void forming step of forming the voids 15 in the crystal substrate 1 can be performed in parallel with the epitaxial growth step of forming the monocrystalline silicon thin film 4. It is not necessary to employ a heating device dedicated to the void formation. Accordingly, the monocrystalline silicon film F1 can be produced within a short time and with a small number of steps, and thus can be produced with high efficiency. This lowers the manufacturing cost of the monocrystalline silicon thin film F1.

When the liquid containing the silicon and indium in the silicon boat 81 is to be utilized for the next formation of the monocrystalline silicon thin film, it is necessary to heat the cooled liquid again to the temperature of about 800° C.–1000° C. for dissolving a sufficient amount of silicon. During the heating of the liquid for sufficiently dissolving the silicon, the next crystal substrate may be heated for forming the voids. In the operation of successively forming the monocrystalline silicon films F1, the film formation can be efficiently performed in the above manner.

According to the method of forming the silicon-contained crystal thin film described above, the voids 15 are formed by immersing the whole crystal substrate 1 in the liquid. Therefore, a pressure can be applied to the ion-injected surface of the crystal substrate 1 when heating the crystal substrate 1 for forming the voids 15. Thereby, it is possible to suppress formation of crater-like minute peeled portions in the ion-injected surface portion of the crystal substrate 1 during formation of the voids. The minute peeling can be suppressed without preparing pressing means dedicated to application of the pressure to the ion-injected surface of the crystal substrate 1.

Figure 3A:
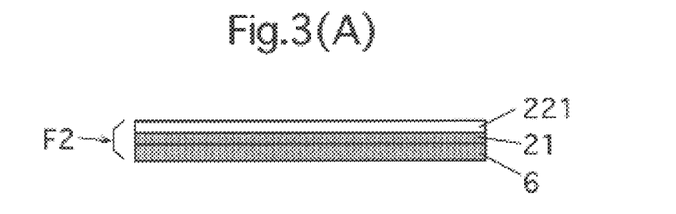
FIG. 3(A) is a schematic cross section of an example of the silicon-contained crystal thin film formed by another method of forming the silicon-contained crystal thin film according to the invention.

(2) FIG. 3(A) is a schematic cross section showing an example of the silicon-contained crystal thin film, which can be formed by the method of forming the silicon-contained crystal thin film of the second type.

A silicon-contained crystal thin film F2 shown in FIG. 3(A) is formed of a monocrystalline silicon film 221, an insulating $SiO_2$ film 21 and an insulating $SiO_2$ film 6 layered together. Thus, the silicon-contained crystal thin film F2 is formed of a monocrystalline silicon film 221 as well as the insulating films, which are the $SiO_2$ films 21 and 6, layered together.

Figure 3B:
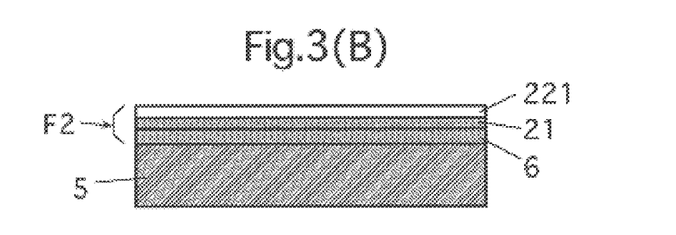
FIG. 3(B) is a schematic cross section of an example of a structure formed by the method of forming the silicon-contained crystal thin film according to the invention, and particularly the structure including the silicon-contained crystal thin film formed on a support substrate.

As shown in FIG. 3(B), the silicon-contained crystal thin film F2 can be formed on the support substrate 5. Thus, a so-called SOI (Silicon On Insulator) substrate can be formed.

The method of forming the silicon-contained crystal thin film F2 will now be described with reference to a step diagram of FIG. 4.

Figure 4:
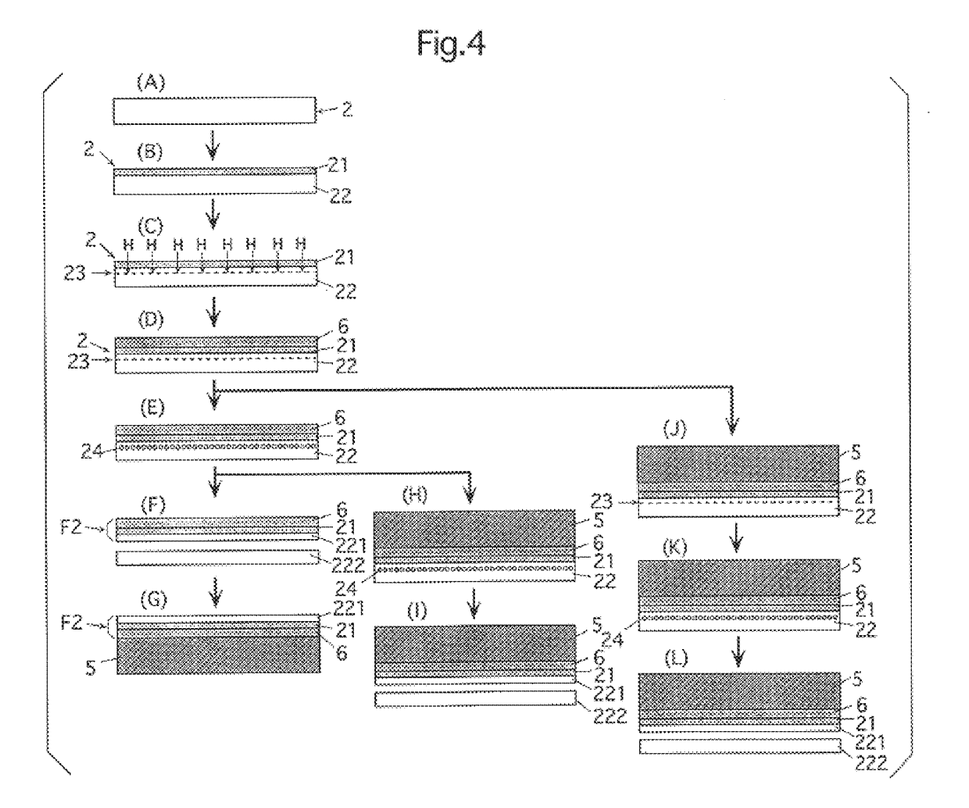
FIG. 4 shows steps in examples of the method of forming the silicon-contained crystal thin film according to the invention, and particularly steps for forming the silicon-contained crystal thin film shown in FIGS. 3(A) and 3(B)

First, a monocrystalline silicon substrate 2 is prepared (see step (A) in FIG. 4). In this example, the prepared crystalline substrate 2 has a wafer-like form.

Then, a thermal oxide film ($SiO_2$ film) 21 is formed at the surface layer on one side of the silicon-contained crystal substrate 2 (see step (B) in FIG. 4). In this example, the $SiO_2$ film 21 has a thickness of 0.9 μm. Thereby, a structure including the $SiO_2$ film 21 and the monocrystalline silicon film 22 layered together is formed.

Then, hydrogen ions are implanted into the monocrystalline silicon substrate 2 from the side of the $SiO_2$ film 21 (see step (C) in FIG. 4). In this example, hydrogen negative ions are implanted with an acceleration voltage of 100 kV. Thereby, the hydrogen ions are implanted to the position at a depth of about 1.0 μm from the surface (ion-injected surface) of the $SiO_2$ film 21. The hydrogen ions are implanted at a density of about $5 \times 10^{16}$ ions/cm$^2$ or more.

Figure 5:
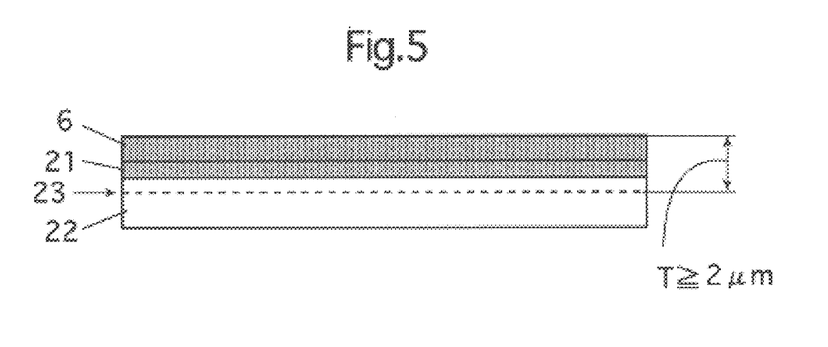
FIG. 5 shows a thickness of a film formed on an ion-injected surface in a film formation step.

Then, the $SiO_2$ film 6 is formed on the ion-injected surface of the substrate 2, and more specifically, on the $SiO_2$ film 21 prepared by the thermal oxidation (see step (D) in FIG. 4). In this example, the $SiO_2$ film 6 is formed by a CVD method in the environment of 350° C. or less. In this example, the $SiO_2$ film 6 has a thickness of 1.0 μm. Thus, the $SiO_2$ film 6 is formed on the crystal substrate 2 such that a distance T of 2 μm or more is kept between the surface of the film 6 and the ion-implanted position 23 (see FIG. 5). The reason for providing the $SiO_2$ film 6 of the above thickness will be described later.

Then, the crystal substrate 2 provided with the $SiO_2$ film 6 is heated to form voids 24 in the ion-implanted position of the crystal substrate 2 (see step (E) in FIG. 4).

In this example, the crystal substrate 2 is heated at 350° C. for 10 minutes for forming the voids 24.

Thereafter, the crystal substrate 2 is separated or divided in the position where the voids 24 are formed, whereby the silicon-contained crystal thin film F2 is obtained. The silicon-contained crystal thin film F2 is form ed of the layered structure including the monocrystalline silicon film 221, which was a portion of the monocrystalline silicon substrate 2, the $SiO_2$ film 21 formed by the thermal oxidation and the $SiO_2$ film 6 formed by the CVD method.

After forming the silicon-contained crystal thin film F2, the support substrate 5 is adhered to the $SiO_2$ film 6 of the thin film F2 so that the thin film F2 can be formed on the support substrate 5 (see step (G) in FIG. 4). Thereby, a so-called SOI substrate, in which the monocrystalline silicon film 221 as well as the insulating films (i.e., $SiO_2$ films 21 and 6) are formed on the support substrate 5, is completed. The support substrate 5 and the thin film F2 ($SiO_2$ film 6)

may be adhered together with an adhesive, or may be adhered together by heating them. The support substrate 5 and the thin film F2 may be adhered together by heating them at about 1100° C. for one or more hours after overlapping them together. Similarly to the foregoing case, a substrate, which has a low heat resistance, and therefore is inexpensive, can be used as the support substrate if the support substrate and the thin film F2 is adhered together with the adhesive.

The following manner may be executed for forming the thin film F2 on the support substrate 5, instead of adhering the thin film F2 to the support substrate 5 after obtaining the silicon-contained crystal thin film F2.

For example, after forming the voids 24 in the crystal substrate 2, the support substrate 5 may be adhered before dividing the crystal substrate 2 in the void-formed position (see step (H) in FIG. 4), and thereafter, the crystal substrate 2 may be divided (see step (I) in FIG. 4). In this case, the support substrate 5 may be adhered with the adhesive for allowing use of a substrate having a relatively low heat resistance as the support substrate 5.

Alternatively, the following manner may be employed. As shown in a step (J) shown in FIG. 4, the support substrate 5 may be laid on the $SiO_2$ film 6, which was formed on the crystal substrate 2, and then heating is performed to form the voids 24 and to adhere the $SiO_2$ film 6 to the support substrate 5 (see step (K) in FIG. 4). Then, the crystal substrate 2 may be divided in the void-formed position (see step (L) in FIG. 4). In this case, the heating for the void formation and the adhesion may be performed, e.g., in the following manner. For example, heating for forming the voids 24 is performed at 350° C. or more for 10 minutes or more, and then heating is performed at about 1100° C. for one or more hours. In this case, a silicone substrate or the like which is resistive to the temperature at about 1100° C. may be employed as the support substrate 5.

In the method of forming the silicon-contained crystal thin film F2 described above, the voids 24 are formed by the heating after forming the $SiO_2$ film 6 on the ion-injected surface (i.e., the surface of $SiO_2$ film 21 in this example) of the monocrystalline silicon substrate 2, as already described. Further, the $SiO_2$ film 6 is formed to keep a distance of 2 $\mu$m or more from the surface of the $SiO_2$ film 6 to the ion-implanted position.

Owing to the above manner and structure, the $SiO_2$ film 6 can apply a pressure to the ion-injected surface of the crystal substrate 2 during the heating for void formation. Therefore, it is possible to suppress such a situation that the surface layer on the ion-injected side of the crystal substrate 2 is partially peeled off to form crater-like portions during the void forming processing. By utilizing the $SiO_2$ film 6, which was formed in the film forming step, as the pressing means for pressing the ion-injected surface, the minute peeling can be suppressed. Even the $SiO_2$ film 6 having a small thickness of about 1 $\mu$m can sufficiently press the ion-injected surface to suppress minute peeling. For suppressing the minute peeling, it is not necessary to prepare pressing means dedicated to the pressing of the ion-injected surface.

Figure 6A:
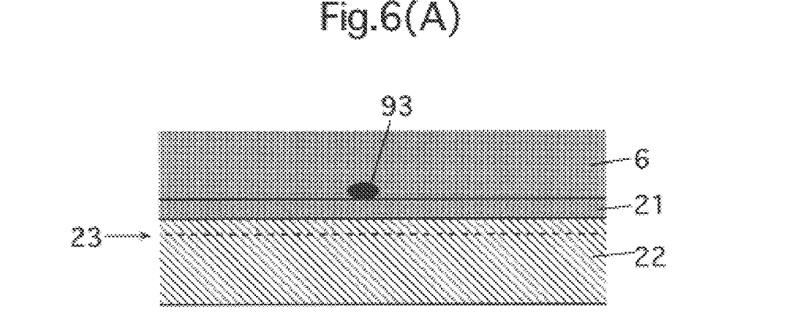
FIGS. 6(A) and 6(B) show a manner of forming a void in the structure including a particle located on the ion-injected surface of the crystal substrate.
Figure 6B:
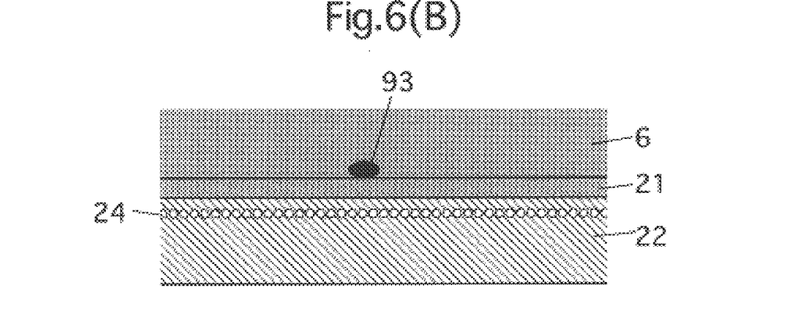

By forming the $SiO_2$ film 6 such that a distance of 2 $\mu$m or more is kept between the surface of the $SiO_2$ film 6 to the ion-implanted position, as already described, minute peeling and cracks, which are shown in FIG. 10, can be suppressed even if the particle is present on the ion-injected surface. This is already confirmed. Probably, the minute peeling and others can be suppressed for the following reasons. Even if the particle 93 is present on the ion-injected surface (i.e., on the $SiO_2$ film 21 formed by the thermal oxidation, in this example), the particle 93 can be buried in the $SiO_2$ film 6, which is further formed on the ion-injected surface by the CVD method (see FIG. 6(A)). By burying the particle 93 in the $SiO_2$ film 6, a portion, which is not be pressed as shown in FIG. 10, is not formed on the ion-injected surface so that minute peeling can be suppressed (see FIG. 6(B)).

Figure 7A:
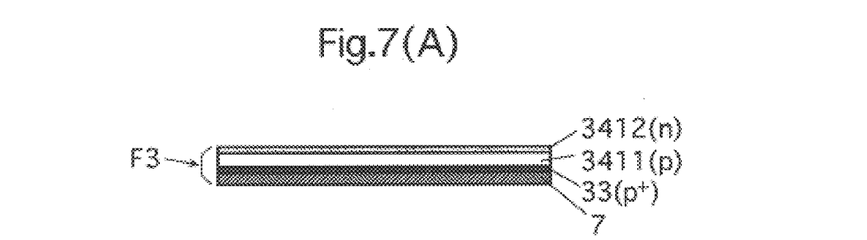
FIG. 7(A) is a schematic cross section of still another example of the silicon-contained crystal thin film formed by the method of forming the silicon-contained crystal thin film according to the invention.

(3) FIG. 7(A) is a schematic cross section of still another example of the silicon-contained crystal thin film, which can be formed by the method of forming the silicon-contained crystal thin film of the second type.

A silicon-contained crystal thin film F3 shown in FIG. 7(A) is formed of an n-type monocrystalline silicon film 3412, a p-type monocrystalline silicon film 3411, a $p^+$-type monocrystalline silicon film 33 and an aluminum film 7, which are layered together.

Figure 7B:
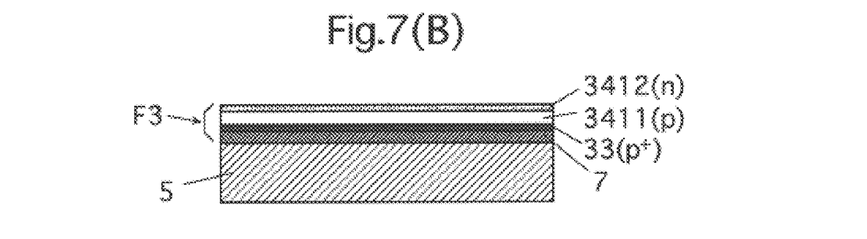
FIG. 7(B) is a schematic cross section of further another example of the structure formed by the method of forming the silicon-contained crystal thin film according to the invention, and particularly the structure including the silicon-contained crystal thin film formed on a support substrate.

As shown in FIG. 7(B), the thin film F3 may be formed on the support substrate 5. The structure including the support substrate 5, which is provided with the thin film F3 as shown in FIG. 7(B), has an $npp^+$ structure formed on the aluminum film 7, which can be used as an electrode, and can be utilized, e.g., in manufacturing of the solar battery.

A method of forming the silicon-contained crystal thin film F3 will now be described with reference to a step diagram of FIG. 8.

Figure 8:
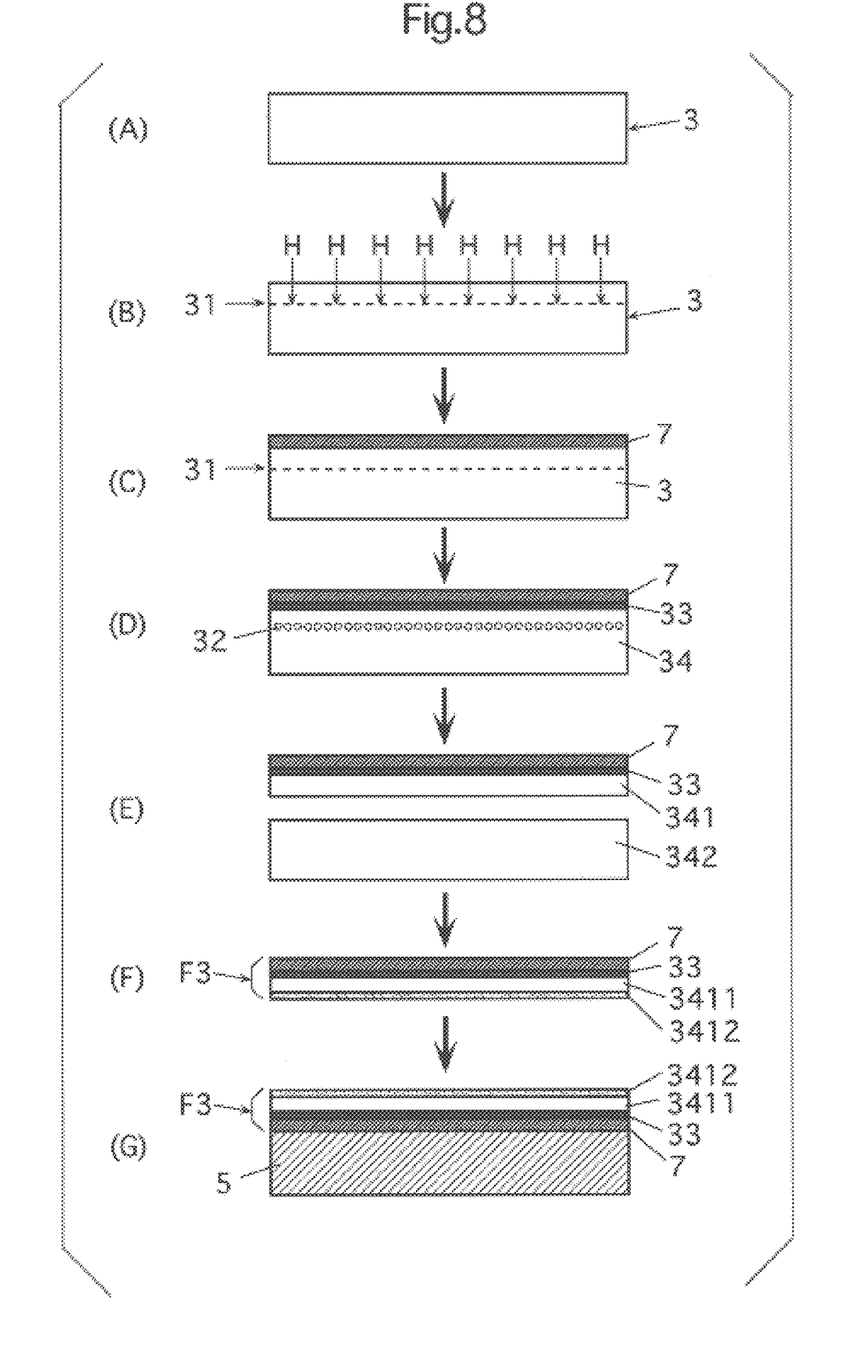
FIG. 8 is a step diagram showing an example of the method of forming the silicon-contained crystal thin film according to the invention, and particularly the method of forming the silicon-contained crystal thin film shown in FIGS. 7(A) and 7(B)

First, a p-type monocrystalline silicon substrate 3 is prepared (see step (A) in FIG. 8). In this example, the prepared crystalline substrate 3 has a wafer-like form.

Then, hydrogen ions are implanted into the monocrystalline silicon substrate 3 (see step (B) in FIG. 8). In this example, hydrogen negative ions are implanted with an acceleration voltage of 100 kV. Thereby, the hydrogen ions are implanted into the position at a depth of about 1.0 $\mu$m from the surface of the crystal substrate 3. The hydrogen ions are implanted at a density of about $5 \times 10^{16}$ ions/cm$^2$ or more.

Then, the aluminum film 7 is formed on the ion-injected surface of the crystal substrate 3 (see step (C) in FIG. 8). By applying paste of aluminum, the aluminum film 7 can be easily and inexpensively formed. In this example, the aluminum film 7 has a thickness of 1 $\mu$m. Thus, the aluminum film 7 is formed such that a distance of 2 $\mu$m or more is kept from the surface of the aluminum film 7 to the ion-implanted position. The reason for employing the aluminum film 7 of the above thickness is the same as that for which the $SiO_2$ film 6 of a similar thickness is employed in the process of forming the silicon-contained crystal thin film F2 already described.

The crystal substrate 3 provided with the aluminum film 7 is heated at a temperature of about 350° C.–600° C. for several minutes or more so that voids 32 are formed in an ion-implanted position 31 (see step (D) in FIG. 8).

In this process, the crystal substrate 3 can be heated at 500° C. or more for one or more hours, whereby the aluminum in the aluminum film 7 can be thermally diffused into the p-type monocrystalline silicon substrate 3. Thereby, a portion of the crystal substrate 3 near the aluminum film 7 can be changed into a $p^+$ layer ($p^+$-type monocrystalline silicon film) 33 (see step (D) in FIG. 8). Other portion 34 of the crystal substrate 3 still has initial p-type characteristics.

Then, the crystal substrate 3 is divided in position where the voids 32 are formed (see step (E) in FIG. 8). Thereby, a structure in which the aluminum film 7, the $p^+$-type monocrystalline silicon film 33 and the p-type monocrystalline silicon film 341 are layered is formed.

Then, phosphorus or the like is diffused through the separated surface of the p-type monocrystalline silicon film 341, whereby an n-layer (n-type monocrystalline silicon film) 3412 is formed in the surface portion of the film 341 (see step (F) in FIG. 8). Other portion 3411 of the film 341 still has initial p-type characteristics.

Thereby, silicon-contained crystal thin film F3 is obtained. In the silicon-contained crystal thin film F3, the $p^+$-type monocrystalline silicon film 33, which is formed by the thermal diffusion of aluminum, the p-type monocrystalline silicon film 3411, which was a portion of the crystal substrate 3, and the n-type monocrystalline silicon film 3412, which is formed by diffusion of phosphorus or the like, are successively formed on the aluminum film 7. More specifically, in the thin film F3, a thin film of an $npp^+$ structure is formed on the aluminum film 7, which can be used as an electrode.

After obtaining the silicon-contained crystal thin film F3, the support substrate 5 is adhered to the aluminum film 7 of this thin film F3 so that the thin film F3 can be formed on the support substrate 5 (see step (G) in FIG. 8). This substrate 5 provided with the thin film F3 can be utilized in manufacturing of a solar battery. Since the thin film of the $npp^+$ structure is formed on the aluminum film 7 utilized as an electrode, it is possible to provide the solar battery of a high photoelectric conversion efficiency.

The support substrate 5 and the thin film F3 (aluminum film 7) may be adhered together with an adhesive or by heating them. After adhering the support substrate 5 to the aluminum film, the substrate 3 may be divided in the void-formed position, whereby the thin film F3 can be likewise formed on the support substrate 5.

Similarly to the case of forming the thin film F2, the thin film F3 is formed in such a manner that the aluminum film 7 is present on the ion-injected surface when the heating is performed for forming the voids. Therefore, the aluminum film 7 can press the ion-injected surface to suppress minute peeling. Since the aluminum film 7 is formed to keep a distance of 2 μm or more from the surface of the aluminum film 7 to the ion-implanted position. Therefore, minute peeling and cracks, e.g., shown in FIG. 10 can be suppressed even if particles are present on the ion-injected surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a silicon-contained crystal thin film comprising:

an ion implanting step of implanting hydrogen ions or helium ions into a silicon-contained crystal substrate containing silicon at 10% or more by weight;

a void forming step of forming a void in an ion-implanted position of said crystal substrate by heating said crystal substrate subjected to the ion implantation;

an epitaxial growth step of immersing the ion-implanted crystal substrate in a melted metal liquid containing silicon, and cooling said liquid to cause epitaxial growth to form a monocrystalline or polycrystalline thin film primarily made of silicon on an ion-injected surface of said substrate; and a dividing step of dividing the crystal substrate provided with the crystal thin film in the void-formed position, wherein the heating of said crystal substrate performed for the void formation in said void forming step is performed by immersing at least the ion-injected surface of said crystal substrate in the melted metal liquid used in said epitaxial growth step.

2. The method of manufacturing the silicon-contained crystal thin film according to claim 1, wherein the heating of said crystal substrate in said void forming step is performed while heating the melted metal liquid used in said epitaxial growth step to a predetermined temperature and/or while cooling said melted metal liquid in aid epitaxial growth step.

3. The method of manufacturing the silicon-contained crystal thin film according to claim 1, wherein the cooling of said melted metal liquid in said epitaxial growth step is performed at a rate from about 0.1° C./minute to about 5° C./minute.

4. The method of manufacturing the silicon-contained crystal thin film according to claim 1, further comprising the step of:

removing a portion previously forming a portion of said crystal substrate, and having the crystal thin film formed in said epitaxial growth step, after said dividing step.

5. The method of manufacturing the silicon-contained crystal thin film according to claim 1, further comprising the step of:

removing metal adhered due to said melted metal liquid from the crystal thin film formed on said crystal substrate in said epitaxial growth step.

6. The method of manufacturing the silicon-contained crystal thin film according to claim 5, further comprising the step of:

adhering a support substrate to the crystal thin film formed in said epitaxial growth step.

7. The method of manufacturing the silicon-contained crystal thin film according to claim 1, wherein said melted metal liquid contains, in addition to the silicon, at least one kind of metal among indium, gallium, aluminum and copper at a rate of 10% or more by weight.

8. The method of manufacturing the silicon-contained crystal thin film according to claim 1, further comprising the step of:

adhering a support substrate to the crystal thin film formed in said epitaxial growth step.

9. A method of forming a silicon-contained crystal thin film comprising:

an ion implanting step of implanting hydrogen ions or helium ions into a silicon-contained crystal substrate primarily made of silicon;

a film forming step of forming a predetermined film on an ion-injected surface of said silicon-contained crystal substrate;

a void forming step of forming a void in an ion-implanted position of said crystal substrate by heating said crystal substrate provided with said film; and a dividing step of dividing said crystal substrate in the void-formed position, wherein said film forming step is performed to provide a thickness of 2 μm or more from a surface of said predetermined film to the ion-implanted position.

10. The method of manufacturing the silicon-contained crystal thin film according to claim 9, wherein said film formed in said film forming step is an insulating film.

11. The method of manufacturing the silicon-contained crystal thin film according to claim 9, wherein
said film formed in said film forming step is an electrically conductive film.

12. The method of manufacturing the silicon-contained crystal thin film according to claim 11, wherein
said electrically conductive film is primarily made of aluminum, and
said method further includes a step of heating the crystal substrate provided with said electrically conductive film at 500° C. or more for one hour or more.

13. The method of manufacturing the silicon-contained crystal thin film according to claim 12, wherein
a p-type monocrystalline silicon substrate is used as said silicon-contained crystal substrate,
said method further includes the step of implanting n-type dopant into said crystal substrate provided with said electrically conductive film through a separation surface formed in said dividing step after said dividing step, and
a thin film of an $npp^+$ structure is formed on said electrically conductive film.

14. The method of manufacturing the silicon-contained crystal thin film according to claim 13, further comprising the step of:
adhering a support substrate to the film formed in said film forming step.

15. The method of manufacturing the silicon-contained crystal thin film according to claim 9, further comprising the step of:
adhering a support substrate to the film formed in said film forming step.

* * * * *